US009425906B2

(12) United States Patent
Lee et al.

(10) Patent No.: US 9,425,906 B2
(45) Date of Patent: Aug. 23, 2016

(54) MIXER AND MIXING METHOD

(71) Applicant: GWANGJU INSTITUTE OF SCIENCE AND TECHNOLOGY, Gwangju (KR)

(72) Inventors: Minjae Lee, Gwangju (KR); Dongju Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/580,765

(22) Filed: Dec. 23, 2014

(65) Prior Publication Data

US 2015/0215051 A1    Jul. 30, 2015

(30) Foreign Application Priority Data

Jan. 27, 2014  (KR) ......................... 10-2014-0009575

(51) Int. Cl.

| | |
|---|---|
| *G06G 7/12* | (2006.01) |
| *H04B 15/00* | (2006.01) |
| *H03K 17/56* | (2006.01) |
| *H04B 15/06* | (2006.01) |
| *H04L 27/152* | (2006.01) |
| *H03D 7/14* | (2006.01) |

(52) U.S. Cl.
CPC .......... *H04B 15/005* (2013.01); *H03D 7/1441* (2013.01); *H03K 17/56* (2013.01); *H04B 15/06* (2013.01); *H04L 27/152* (2013.01)

(58) Field of Classification Search
CPC ... H03D 7/1485; H03D 7/1435; H03D 7/125; H03D 7/1428; G06G 7/14

USPC .......................................................... 327/355
See application file for complete search history.

(56) References Cited

U.S. PATENT DOCUMENTS

| | | | |
|---|---|---|---|
| 8,620,254 B2 * | 12/2013 | Molnar ................ | H03G 3/3052 455/324 |
| 2011/0221506 A1 * | 9/2011 | Tamura .................... | H03K 5/13 327/355 |

OTHER PUBLICATIONS

Raja S Pullela et al., Low Flicker-Noise Quadrature Mixer Topology, Conference-Symposium, Feb. 8, 2006, 10 pages, IEEE International Solid-State Circuits Conference.

Aslam A Rafi et al., A Harmonic Rejection Mixer Robust to RF Device Mismatches, Conference-Symposium, Feb. 21, 2011, 3 pages, IEEE International Solid-State Circuits Conference.

* cited by examiner

*Primary Examiner* — Lincoln Donovan
*Assistant Examiner* — Diana J Cheng
(74) *Attorney, Agent, or Firm* — Hauptman Ham, LLP

(57) ABSTRACT

Disclosed herein is a mixer. The mixer may include an MLO switching unit configured to include at least three MLO switches provided in odd numbers and configured to branch a signal from an input stage and to receive respective MLO signals and an LO switching unit configured to include pairs of LO switches connected in parallel to output sides of the MLO switches, wherein each of the pairs of LO switches corresponds to each of the MLO switches. Each of the pairs of LO switches is connected to the positive and negative intermediate frequency (IF) output sides so that the output sides of each of the pairs of LO switches alternately apply output signals to the positive and negative IF output sides when LO signals are sequentially input to each of the pairs of LO switches.

12 Claims, 7 Drawing Sheets

MLO1 pulse is centered on LO1 pulse.

MIXER AND MIXING METHOD

CROSS REFERENCE TO RELATED APPLICATION

This application claims the benefit of Korean Patent Application No. 10-2014-0009575, filed on Jan. 27, 2014, entitled "MIXER AND MIXING METHOD", which is hereby incorporated by reference in its entirety into this application.

BACKGROUND

1. Technical Field

The present disclosure relates to a mixer, and more particularly, to an active mixer.

2. Related Art

Direct conversion receivers used in a wireless communication system require a mixer capable of implementing a low flicker noise (i.e., a 1/f noise), high linearity, that is, a high $3^{rd}$ order intercept point (IP3) and a $2^{nd}$ order intercept point (IP2).

An active mixer has a high signal to noise ratio because it has a high flicker noise and low linearity in a low frequency band. Accordingly, the active mixer has a problem in that it is unable to be used in the direct conversion receiver. Furthermore, the active mixer is problematic in that it is difficult to be actually applied although it has an advantage of obtaining high output with respect to a passive mixer due to the problem.

SUMMARY

Various embodiments are directed to proposing a mixer and a mixing method, which are capable of lowering a flicker noise corner up to several kHz by up-converting a flicker noise and obtaining a high IP2 and a high IP3 owing to an advantage of being insensitive to the mismatching of a signal.

In an embodiment, a mixer may include a master local oscillator (MLO) switching unit configured to include at least three MLO switches provided in odd numbers and configured to branch a signal from an input stage and to receive respective MLO signals and a local oscillator (LO) switching unit configured to include pairs of LO switches connected in parallel to output sides of the MLO switches, wherein each of the pairs of LO switches corresponds to each of the MLO switches and output sides of each of the pairs of LO switches are connected to respective positive and negative intermediate frequency (IF) output sides. Each of the pairs of LO switches may be connected to the positive and negative IF output sides so that the output sides of each of the pairs of LO switches alternately apply output signals to the positive and negative IF output sides when LO signals are sequentially input to each of the pairs of LO switches. In accordance with an embodiment of the present invention, there are advantages in that a flicker noise can be up-converted, the mixer can become insensitive to the mismatching of a signal, and linearity can be improved.

In this case, the MLO switches may be implemented in odd numbers, and the mixer may be implemented most economically using three MLO switches. Furthermore, a signal having a frequency of $2f_{LOeff}/n$ may be input to the MLO switch, and a signal having a frequency of $f_{LOeff}/n$ may be input to the LO switch, wherein "n" is the number of MLO switches. In accordance with the frequency signal, the mixer can be driven most efficiently. In this case, a flicker noise that is output by the mixer can be up-converted into a frequency of $f_{LOeff}/n$ frequency because it has a specific period.

Furthermore, in an embodiment of the present invention, the MLO signal may have a maximum effect when the pulse of the MLO signal is placed in the middle of the pulse of the LO signal.

Furthermore, the mixer may further include a signal provision unit configured to provide the LO signals and the MLO signals. The signal provision unit may include a counting unit configured to include counters associated with each other in order to provide the LO signals. Accordingly, an LO signal can be provided simply, conveniently, and accurately. Furthermore, the signal provision unit includes an XNOR gate unit configured to receive the LO signals of the counting unit and generate the MLO signals. Accordingly, the pulse of each MLO signal can be automatically placed in the middle of the pulse of each LO signal without separate timing control between the MLO signal and the LO signal. The signal provision unit may further include an alignment unit configured to include D flip-flops for aligning the MLO signals so that they are output at the same timing.

Furthermore, a buffer may include an input-delayed inverter configured to receive an MLO signal through a PMOS, receive a delayed MLO signal from another buffer through an NMOS, and delay the down time of the MLO signal. Accordingly, better linearity can be secured because a change at the source node of an MLO transistor is reduced by a high-crossing action between MLO signals.

In an embodiment, a mixer may include an odd number of at least master local oscillator (MLO) switches configured to branch a high frequency signal and receive respective MLO signals and pairs of local oscillator (LO) switches connected in parallel to output sides of the MLO switches and each configured to include each of the MLO switches. The output sides of each of the pairs of LO switches may be respectively connected to separated positive and negative intermediate frequency (IF) output sides so that the output sides of the LO switches alternately output respective output signals to the positive and negative IF output sides. In accordance with the configuration, a flicker noise can be up-converted. In this case, the flicker noise can be sufficiently removed through post-processing using a filter because it can be up-converted into a signal similar to a sine wave signal.

In an embodiment, a mixing method may include inputting a high frequency signal, inputting master local oscillator (MLO) signals, each having a frequency of $2f_{LOeff}/n$, to MLO switches in a cascode way and inputting local oscillator (LO) signals, each having a frequency of $f_{LOeff}/n$, to LO switches so that an output signal having a frequency of $f_{LOeff}$ is output to an intermediate frequency (IF) output side, and up-converting a flicker noise into a signal having the frequency of $f_{LOeff}/n$, wherein the "n" may be the number of MLO switches. In accordance with the mixing method, a flicker noise can be removed.

In this case, the MLO switch may be placed between the LO switches. Accordingly, the mixing method can be stably performed.

DETAILED DESCRIPTION

Hereinafter, a mixer and a mixing method will be described in detail with reference to the accompanying drawings through various examples of embodiments. The spirit of the present invention is not limited to the following embodiments, and those skilled in the art who understand the spirit of the present invention may readily propose other embodiments included in the scope of the same spirit by adding, changing, and deleting at least one element. The addition, change, and deletion should be construed as being included in the scope of the spirit of the present invention.

Figure 1:
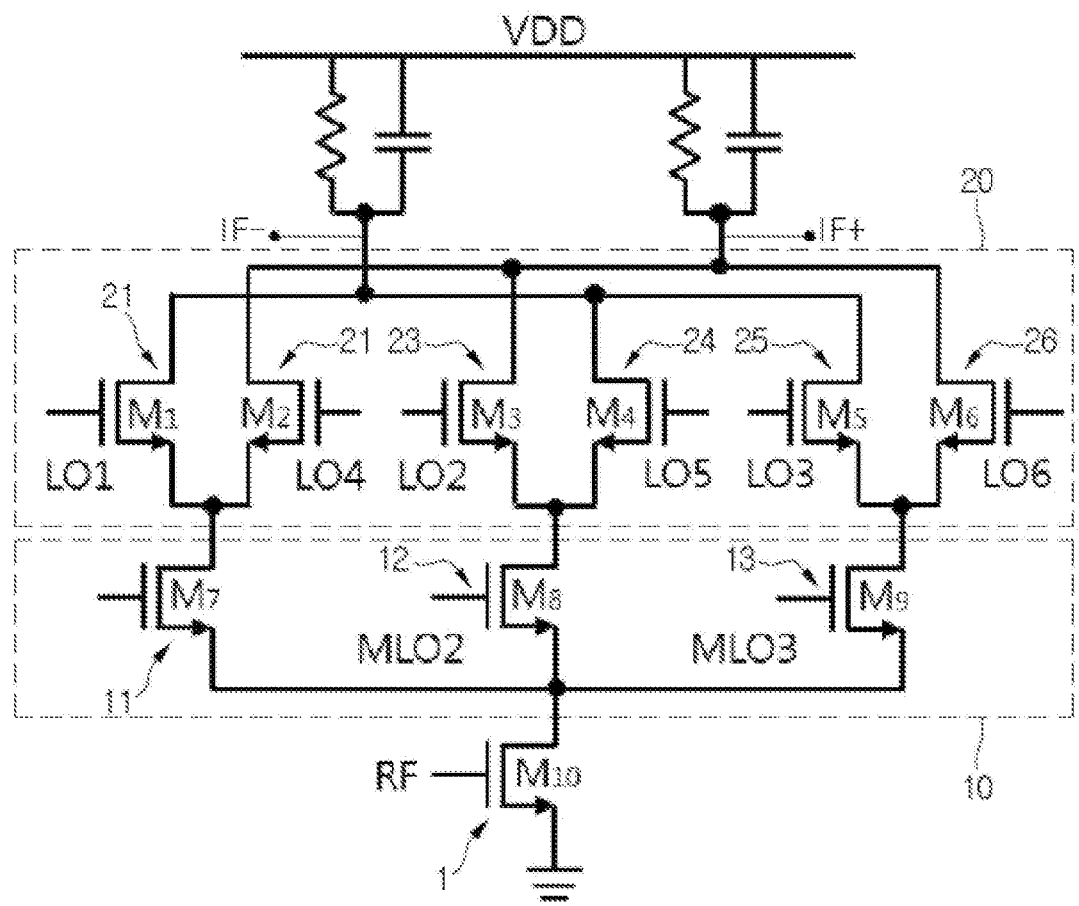
FIG. 1 illustrates a mixer according to an embodiment.

FIG. 1 illustrates a mixer according to an embodiment.

Referring to FIG. 1, the mixer according to an embodiment includes a master local oscillator (MLO) switching unit 10 including an odd number of MLO switches 11, 12, and 13 (M7, M8, M9) configured to receive signals branched from the signal of an input stage 1 (M10) and a local oscillator (LO) switching unit 20 including three pairs of parallel structures on the output sides of the respective MLO switches 11, 12, and 13 (M7, M8, M9) of the MLO switching unit 10. The MLO switches 11, 12, and 13 of the MLO switching unit 10 are controlled by MLO signals MLO1, MLO2, and MLO3. The LO switching unit 20 is controlled by LO signals LO1 to LO6. The LO switches 21 and 22 (M1, M2), 23 and 24 (M3, M4), and 25 and 26 (M5, M6) of the LO switching unit 20 form respective pairs. The input sides of the LO switches of the LO switching unit 20 are connected in parallel to the output sides of the respective MLO switches 11, 12, and 13. The output side of the LO switching unit 20 is connected to positive and negative intermediate frequencies (IFs) output sides IF− and IF+ through a specific coupling structure.

The MLO signals each having a frequency of $2f_{LOeff}/3$ are sequentially input as MLO1, MLO2, and MLO3. The LO signals each having a frequency of $f_{LOeff}/3$ are sequentially input to the LO switches M1, M2, M3, M4, M5, and M6.

The number of MLO switches 11, 12, and 13 is odd. Since the number of MLO switches is odd, the required frequencies of LO signal can be further lowered. The LO switches 21 and 22, 23 and 24, and 25 and 26 form respective pairs and are connected in parallel to the output sides of the MLO switches 11, 12, and 13. The pulse of each MLO signal may be placed in the middle of the pulse of each LO signal. Accordingly, signals passing through the MLO switches 11, 12, and 13 are not influenced by the turn on/off of the LO switches 21 and 22, 23 and 24, and 25 and 26.

Connection on the output sides of the LO switching unit 20 is described in more detail below.

The first MLO switch 11 and the first LO switch 21 and the second LO switch 22 connected to the output side of the first MLO switch are described as an example. A signal received through the first MLO switch 11 under the control of the MLO signal is output in the form of an IF through the first LO switch 21 and the second LO switch 22. In this case, the first LO switch 21 is connected to the negative IF output side IF−, and the second LO switch 22 is connected to the positive IF output side IF+. Accordingly, signals may be alternately output to the negative and positive IF output sides IF− and IF+.

The second MLO switch 12 and the third LO switch 23 and the fourth LO switch 24 connected to the output side of the second MLO switch 12 perform an operation different from that described above. More specifically, a signal received through the second MLO switch 12 under the control of the MLO signal is output through the third LO switch 23 and the fourth LO switch 24. In this case, the third LO switch 23 is connected to the positive IF output side IF+, and the fourth LO switch 24 is connected to the negative IF output side IF−. Accordingly, the third LO switch 23 and the fourth LO switch 24 alternately output signals to the negative and positive IF output sides IF− and IF+ in a direction opposite the direction of the first (second) LO switch 21 (22).

The third MLO switch 13 and the fifth LO switch 25 and the sixth LO switch 26 connected to the output side of the third MLO switch are connected and output signals to the negative and positive IF output sides like the first MLO switch 11, the first LO switch 21, and the second LO switch 22.

Accordingly, MLO signals go to the negative and positive IF output sides alternately and construct the effective LO signal ($LO_{EFF}$) having a frequency of $f_{LOeff}$.

Figure 2:
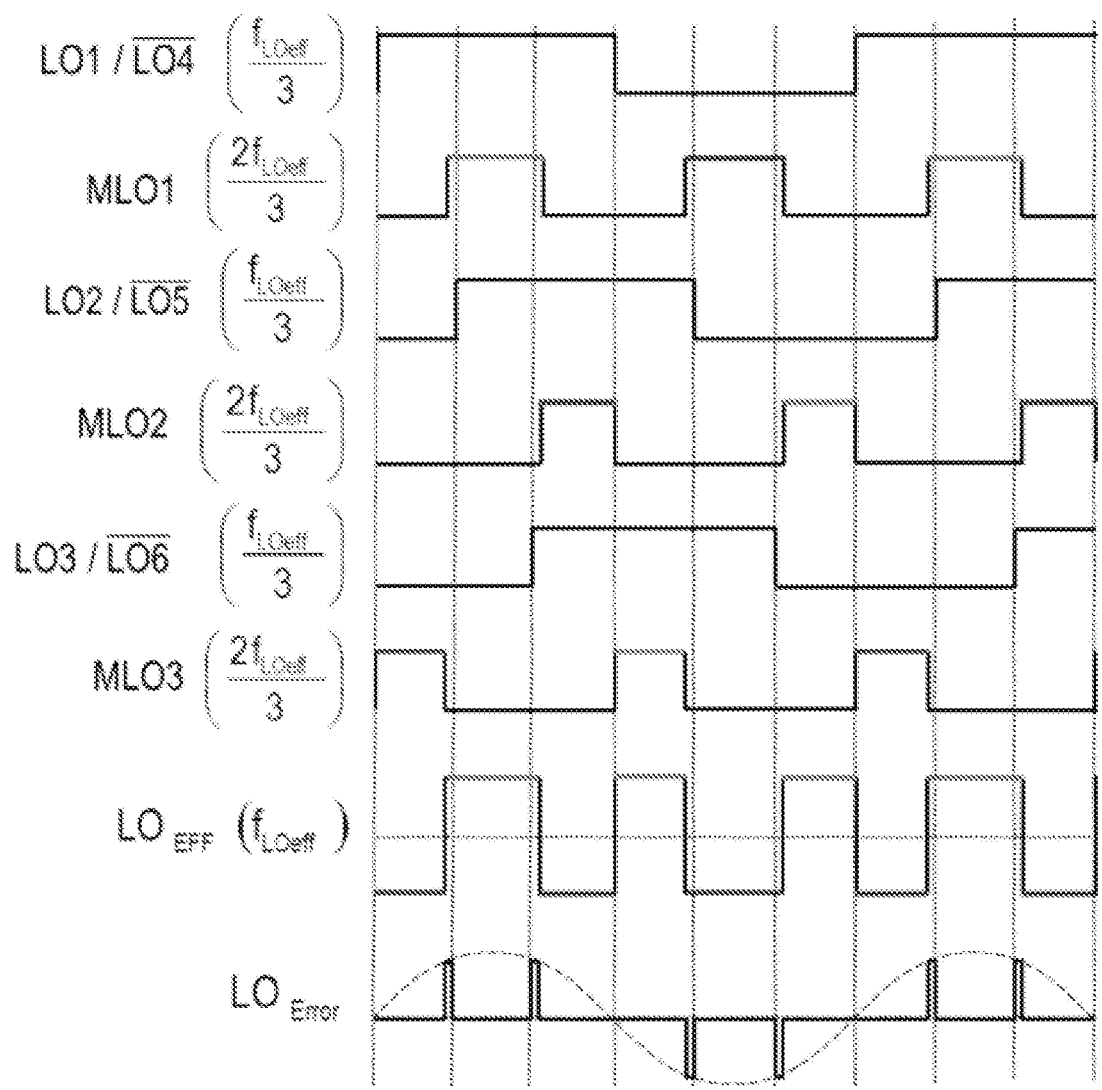
FIG. 2 is a diagram illustrating the MLO signal, LO signal, and 1/f noise of the mixer in a waveform form.

FIG. 2 is a diagram illustrating the MLO signal, LO signal, and 1/f noise of the mixer in a waveform form.

Although only LO1 and LO3 signals are illustrated in FIG. 2, LO1 and LO4 signals have opposite phases and the remnants are the same. The same is true of LO2 and LO5, LO3 and LO6 signals. The pulse of an MLO1 signal is placed in the middle of the pulse of the signal LO1. The MLO signal passes through the LO switches, and the signals are alternately output in the form of positive and negative IFs. It may be sufficiently expected that this action may occur in all the MLO switches and the LO switches. Accordingly, it may be seen that the signal $LO_{EFF}$ on the IF output side is output in the form of a frequency $f_{eff}$. In this case, it may be seen that a 1/f noise (i.e., a flicker noise) generated when the MLO signal becomes on/off is a signal $LO_{ERROR}$, alternately output in the form of positive and negative Ifs without being output only in one direction unlike the LO signal, and up-converted into a sine wave not a common pulse signal. Accordingly, it may be seen that the signal $LO_{ERROR}$ is up-converted into the frequency of $f_{LOeff}/3$. The signal $LO_{ERROR}$ can be subsequently filtered using a filter. Accordingly, a problem attributable to the flicker noise does not generate a problem in a subsequent circuit. In FIG. 2, the MLO1 signal has been illustrated as having a slightly wide width in order to illustrate $LO_{ERROR}$ when an error signal is generated. The same is true of other MLO signals.

The signal $LO_{ERROR}$ can be up-converted using the MLO switches provided in odd numbers as described above. The aforementioned embodiment has been illustrated as being applied to three MLO switches, but is not limited thereto. For example, the number of MLO switches may be increased to 5, 7 or the like. In this case, the MLO signal and the LO signal are the same other than denominators that divide $f_{LOeff}$. In the LO switches that are configured in pairs and provided in parallel, only the terminals of the LO switches on the IF output side to which the output stages of the LO switches are connected may be alternately changed as the serial number increases, and the remnants are the same.

In this case, in order to simplify a circuit diagram, three MLO switches may be used.

The mixer may have an advantage in that it can suppress the remaining flicker noise that results from parasitic capacitance at the source node of LO switches by implementing an LO signal having the low frequency of $f_{LOeff}/3$ using odd-numbered MLO switches. If the number of MLO switches is an even number, not the frequency of $f_{LOeff}/3$, but the LO switches having the high frequency of $f_{LOeff}$ may be required. Furthermore, $2^{nd}$ inter-modulation (IM2) attributable to the mismatching of the MLO signal that occurs in the MLO switch may be up-converted into a high frequency. IM2 occurring in the LO switch may disappear because the MLO signal becomes off upon switching and thus an electric current does not flow into the LO switch.

Figure 3:
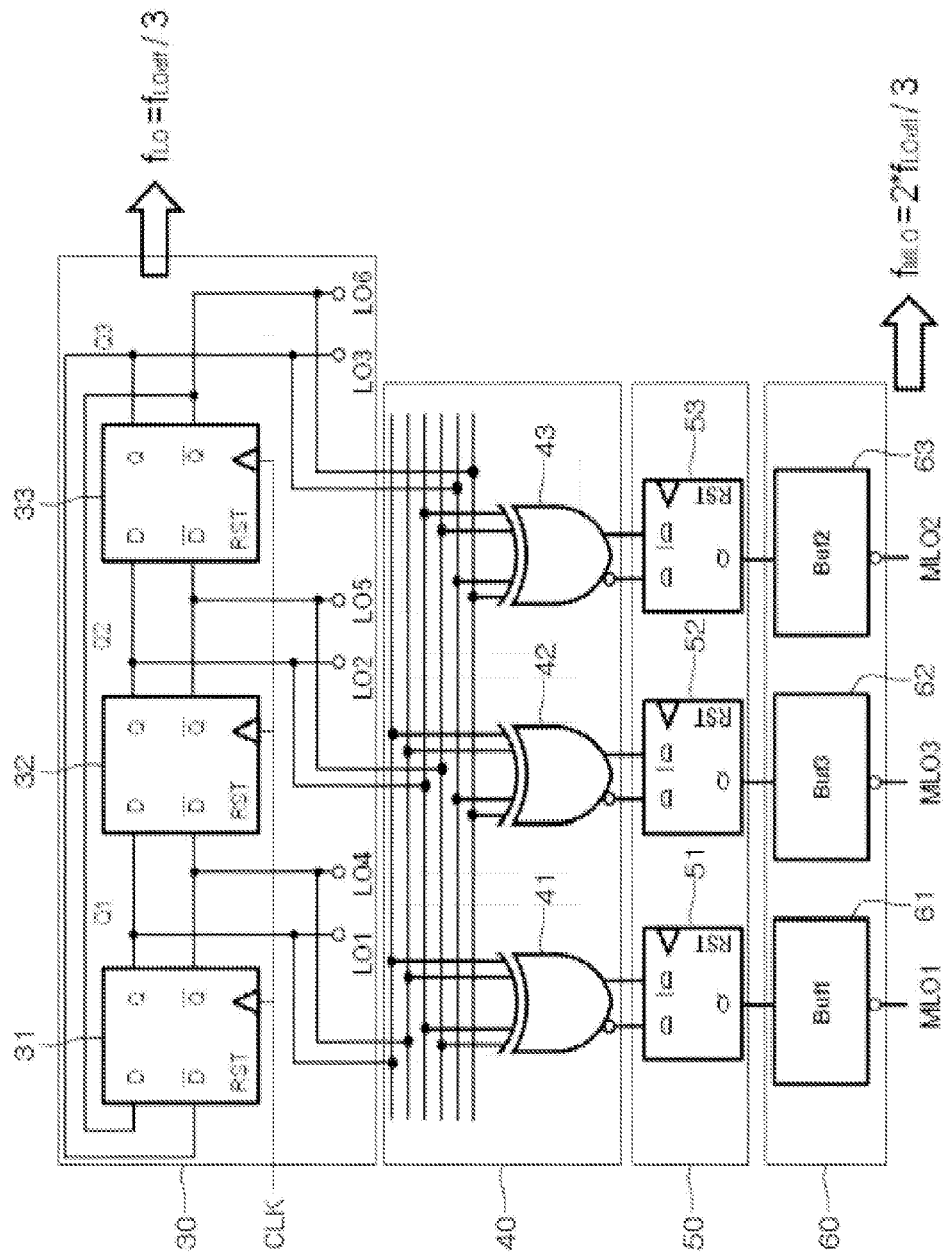
FIG. 3 is a block diagram of a signal provision unit for providing an MLO signal and an LO signal.

FIG. 3 is a block diagram of a signal provision unit for providing the MLO signal and the LO signal.

Referring to FIG. 3, a counting unit 30 receives an external clock signal CLK and generates six LO signals LO1 to LO6 using a synchronous Johnson counter. To this end, the counting unit 30 uses three flip-flops 31, 32, and 33. The counting unit 30 may provide the six LO signals using the three flip-flops because two LO signals form a pair. A gate unit 40 generates MLO signals through respective XOR/XNOR gates 41, 42, and 43 using four of the six LO signals. In this case, the pulse of the MLO signal is placed in the middle of the pulse of the LO signal. However, the MLO signals may have different pulse widths due to device mismatches or an unexpected noise. In this case, there is provided an alignment unit 50 so that the MLO signals are retimed with the same pulse width. Signals from the gate unit 40 pass through the D flip-flops 51, 52, and 53 of the alignment unit 50. The D flip-flops 51, 52, and 53 are provided with the same external clock so that the MLO signals are accurately generated.

Figure 4:
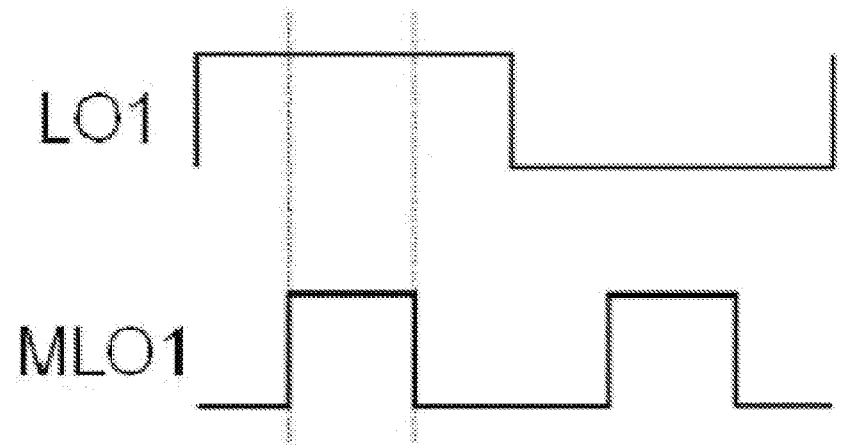
FIG. 4 is a diagram illustrating the matching state of an LO signal and an MLO signal.

FIG. 4 is a diagram illustrating the matching state of the LO signal and the MLO signal. FIG. 4 illustrates that a specific LO signal (e.g., LO1) is accurately centered on a specific MLO signal (MLO1) corresponding to the LO signal through the XOR/XNOR gate 41, 42, 43.

Since the LO signals and the MLO signals are automatically aligned, separate delay buffers are not required for the MLO signals and the LO signals and the mixer can smoothly operate even in a wideband and a multiband. In other words, if a clock having a specific frequency has only to be given although there is no artificial control operation, an MLO signal having a pulse automatically centered on the pulse of an LO signal can be obtained. Accordingly, a simple and reliable signal providing circuit can be obtained.

Referring back to FIG. 3, the MLO signal aligned along with the LO signals are transferred to a buffering unit 60. Three buffers 61, 62, and 63 of the buffering unit 60 finally provide respective MLO1, MLO2, and MLO3 signals. The buffers 61, 62, and 63 are cascade-connected.

Figure 5:
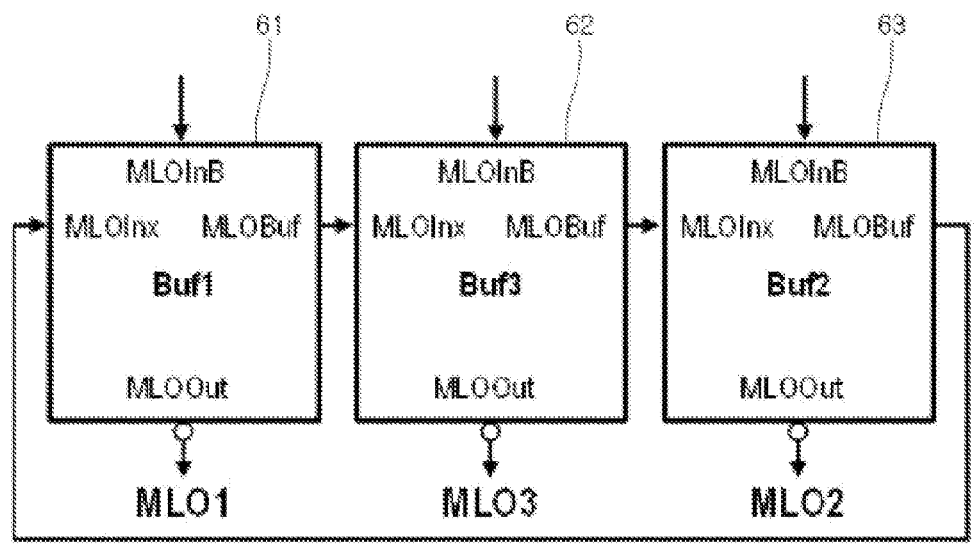
FIG. 5 is a diagram illustrating the structure of a buffering unit.
Figure 6:
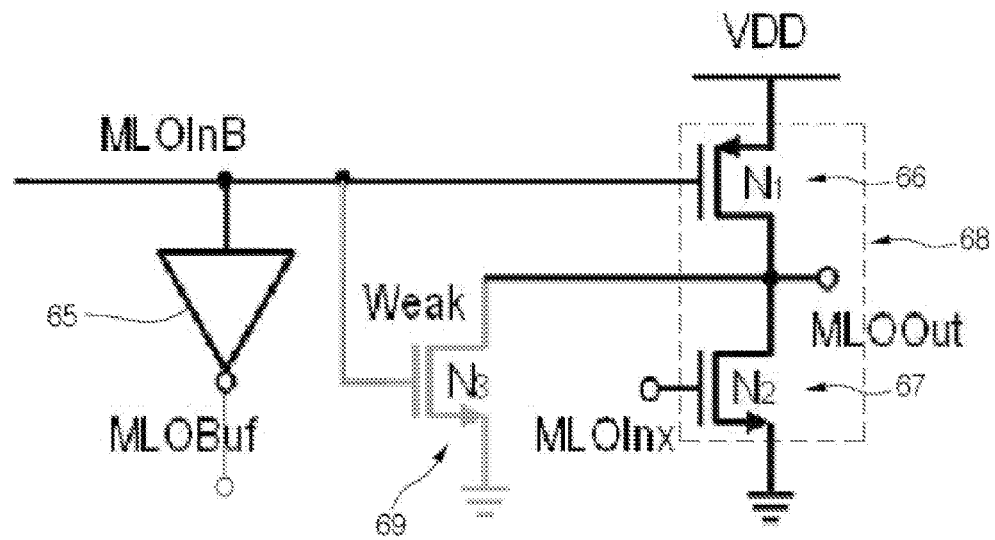
FIG. 6 is a circuit diagram of any one buffer.

FIG. 5 is a diagram illustrating the structure of the buffering unit 60, and FIG. 6 is a circuit diagram of any one buffer.

Referring to FIGS. 5 and 6, each of the buffers 61, 62, and 63 may include four input/output terminals. More specifically, each of the buffers 61, 62, and 63 may include a first input terminal MLOInB for receiving a signal from the alignment unit 50, a first output terminal MLOOut for outputting the final MLO signal to be supplied to the MLO switching unit 10, a second output terminal MLOBuf for outputting the control signal of an adjacent buffer that provides a next MLO signal, and a second input terminal MLOInx for receiving the control signal of an adjacent buffer (i.e., the output signal of the second output terminal MLOBuf) that has provided a previous MLO signal.

Referring to FIG. 6, each of the buffers 61, 62, and 63 includes a common inverter 65 configured to receive the signal of the first input terminal MLOInB and provide a signal to the second output terminal MLOBuf. Furthermore, each of the buffers 61, 62, and 63 includes an input-delayed inverter 68 configured to include the second input terminal MLOInx for receiving a signal from the first input terminal MLOInB and an MLOBuf signal from a buffer adjacent to a corresponding buffer and the first output terminal MLOOut for outputting the final MLO signal.

The common inverter 65 delays a signal received from the alignment unit 50 for a specific time $\Delta T_{INV}$ and outputs the delayed signal to the second output terminal MLOBuf. Accordingly, a next buffer that has received the output signal of the second output terminal MLOBuf performs a specific delay operation. Furthermore, the input-delayed inverter 68 receives a signal from the alignment unit 50 through a PMOS 66 and outputs the final MLO signal through the first output terminal MLOOut. Furthermore, the input-delayed inverter 68 receives the control signal of an adjacent buffer (i.e., the output signal of the second output terminal MLOBuf) that has provided a previous MLO signal through the second input terminal MLOInx and an NMOS 67 and outputs the final MLO signal. As a result, the NMOS 67 receives a signal, delayed for the specific time $\Delta T_{INV}$, from a previous buffer. Accordingly, when the final MLO signal flows down, the flow-down of the final MLO signal is stated after the final MLO signal is delayed for the specific time $\Delta T_{INV}$.

In accordance with the aforementioned operation, the MLOS signals do not slope due to their mutual high-crossing actions, thereby improving linearity. It was found that an input $3^{rd}$ order intercept point (IIP3) was improved about 6 dB through the high-crossing actions.

Figure 7:
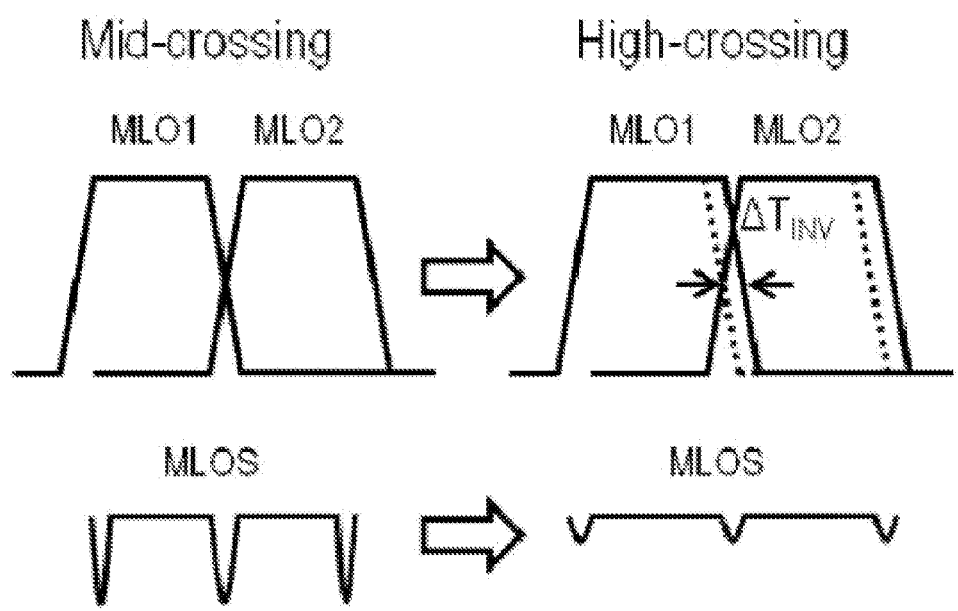
FIG. 7 is a diagram illustrating the high-crossing action of MLO signals.

FIG. 7 is a diagram illustrating the high-crossing action of the MLO signals.

From FIG. 7, it may be seen that in the case of conventional mid-crossing not using the buffer of the present invention, MLOS at the source node of an MLO transistor significantly slopes because a change of an MLO signal is great at a portion where the MLO1 signal overlaps with the MLO2 signal. In contrast, it may be seen that in the case of high-crossing of the present invention, the final MLOS fluctuation can be suppressed so much because the MLO1 signal flows down after it is delayed for the specific time $\Delta T_{INV}$. Accordingly, IIP3 is improved because the large voltage excursion on the sensitive RF signal path is reduced.

Referring back to FIG. 6, a holding device 69 is connected to the first output terminal MLOOut of the buffer. The holding device 69 may have a small size. The input signal of the first input terminal MLOInB is applied to the holding device 69. If 1 is applied to the PMOS 66 and 0 is applied to the NMOS 67, the input-delayed inverter 68 does not operate. In this case, the holding device 69 is connected to a small transistor connected to the first output terminal MLOOut in order to fix output to the ground and thus prevent the output from being shaken.

Figure 8:
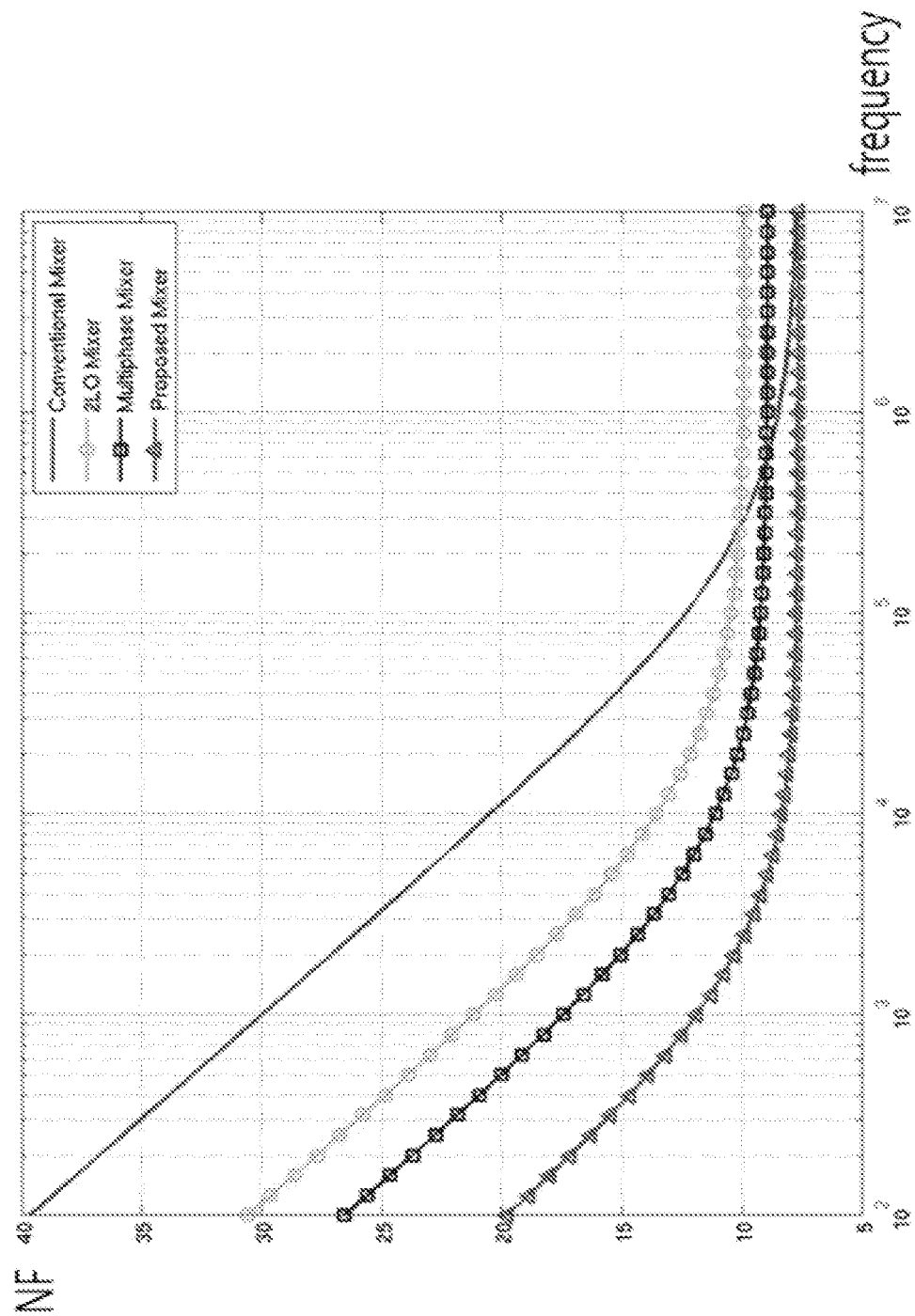
FIG. 8 illustrates noise indices according to frequencies and illustrates a comparison between four cases.

FIG. 8 illustrates noise indices according to frequencies and illustrates a comparison between four cases. FIG. 8 illustrates a comparison between the noise indices of the mixer according to an embodiment (i.e., a first case), a conventional Gilbert type mixer (http://en.wikipedia.org/wiki/Gilbert_cell) (i.e., a second case), R. Pullela, T. Sowlati and D. Rozenblit "Low flicker-noise Quadrature Mixer Topology", IEEE Int. Solid-State Circuits Conf. (ISSCC) Dig. Tech. Papers, pp. 1870-2006 (2LO mixer) (i.e., a third case), that is, a technology for reducing a flicker noise using two LO stages, and a multiphase mixer proposed by Rafi, A. A.; Piovaccari, A.; Vancorenland, P.; Tuttle, T.; "A harmonic rejection mixer robust to RF device mismatches," Solid-State Circuits Conference Digest of Technical Papers (ISSCC, 2011 IEEE International, vol. no. pp. 66-68, 20-24

Feb. 2011 (i.e., a fourth case), that is, a technology for reducing a flicker noise using a rotating multiphase.

It may be seen that the embodiment has the smallest flicker noise from the graph of FIG. 8 that illustrates the results of simulations performed on the four cases.

Figure 9:
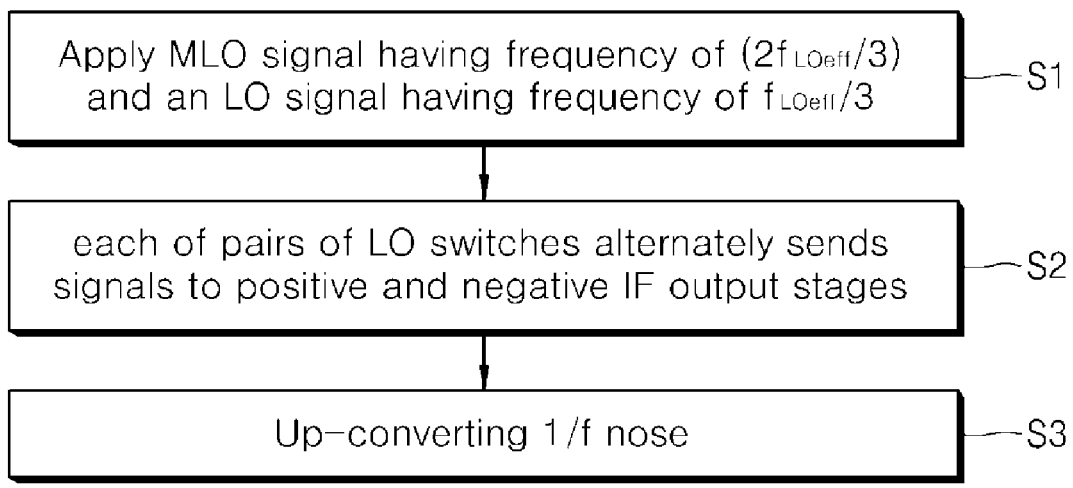
FIG. 9 is a flowchart illustrating a mixing method according to an embodiment.

FIG. 9 is a flowchart illustrating a mixing method according to an embodiment.

Referring to FIG. 9, when a high frequency is received, the MLO signal having the frequency of $2f_{LOeff}/3$ is input to an odd number of the MLO switches, and the LO signal having the frequency of $f_{LOeff}/3$ is input to the LO switches at step S1. In this case, a pair of LO switches is connected in parallel to a single MLO switch.

In applying the MLO signal and the LO signal, when the MLO signal is applied, a corresponding pair of LO switches alternately send signals to the positive and negative IF output stages at step S2. In this case, a pair of LO switches corresponding to an MLO switch to which a next MLO signal is applied also alternately send signals to the positive and negative IF output stages. In this case, in accordance with the switching operation that enables the final output to be alternately output as a negative or positive signal, a flicker noise that is accompanied by the on/off of an MLO signal can be up-converted into a sine wave at step S3.

The mixer in accordance with an embodiment of the present invention may have advantages of a low flicker noise and high linearity and many advantages that do not appear due to the essence of the configuration of the invention.

While various embodiments have been described above, it will be understood to those skilled in the art that the embodiments described are by way of example only. Accordingly, the disclosure described herein should not be limited based on the described embodiments.

What is claimed is:

1. A mixer, comprising:
a master local oscillator (MLO) switching unit configured to comprise at least three MLO switches provided in odd numbers and configured to branch a signal from an input stage and to receive respective MLO signals; and
a local oscillator (LO) switching unit configured to comprise pairs of LO switches connected in parallel to output sides of the MLO switches, wherein each of the pairs of LO switches corresponds to each of the MLO switches and output sides of each of the pairs of LO switches are connected to respective positive and negative intermediate frequency (IF) output sides,
wherein each of the pairs of LO switches is connected to the positive and negative IF output sides so that the output sides of each of the pairs of LO switches alternately apply output signals to the positive and negative IF output sides when LO signals are sequentially input to each of the pairs of LO switches,
wherein a signal having a frequency of $2f_{LOeff}/n$ is input to the MLO switch,
wherein a signal having a frequency of $f_{LOeff}/n$ is input to the LO switch,
wherein "n" is the number of MLO switches, and
wherein a flicker noise is up-converted into the frequency of $f_{LOeff}/n$.

2. The mixer of claim 1, wherein a number of MLO switches is three.

3. The mixer of claim 1, wherein the flicker noise is up-converted into a signal similar to a sine wave signal.

4. The mixer of claim 1, wherein the MLO signal has a pulse placed in a middle of a pulse of the LO signal.

5. The mixer of claim 1, further comprising:
a signal provision unit configured to provide the LO signals and the MLO signals,
wherein the signal provision unit comprises a counting unit configured to comprise counters associated with each other in order to provide the LO signals.

6. The mixer of claim 5, wherein the counter comprises a synchronous Johnson counter.

7. The mixer of claim 5, wherein the signal provision unit further comprises:
a gate unit configured to receive the LO signals of the counting unit and to align the MLO signals so that a pulse of each of the MLO signals is placed in a middle of a pulse of each of the LO signals; and
a buffering unit configured to comprise buffers for receiving output signals of the gate unit and generating delay signals so that high-crossing between the MLO signals is possible.

8. The mixer of claim 7, wherein the signal provision unit further comprises an alignment unit configured to comprise D flip-flops for aligning the output signals of the gate unit so that the pulse of each of the MLO signals is placed in the middle of the pulse of each of the LO signals.

9. The mixer of claim 7, wherein each of the buffers comprises:
an inverter configured to delay a delay signal, and
an input-delayed inverter configured to receive the delay signal from another buffer and delay a down time of the MLO signal.

10. A mixer, comprising:
an odd number of at least master local oscillator (MLO) switches configured to branch a high frequency signal and receive respective MLO signals; and
pairs of local oscillator (LO) switches connected in parallel to output sides of the MLO switches and each configured to comprise each of the MLO switches,
wherein output sides of each of the pairs of LO switches are respectively connected to separated positive and negative intermediate frequency (IF) output sides so that the output sides of the LO switches alternately output respective output signals to the positive and negative IF output sides, and
wherein a flicker noise is up-converted in a signal similar to a sine wave signal.

11. A mixing method, comprising:
inputting a high frequency signal;
inputting master local oscillator (MLO) signals, each having a frequency of $2f_{LOeff}/n$, to MLO switches in a cascode way and inputting local oscillator (LO) signals, each having a frequency of $f_{LOeff}/n$, to LO switches so that an output signal having a frequency of $f_{LOeff}$ is output to an intermediate frequency (IF) output side; and
up-converting a flicker noise into a signal having the frequency of $f_{LOeff}/n$,
wherein the "n" is a number of MLO switches.

12. The mixing method of claim 11, wherein each of the MLO signals has a pulse placed in a middle of a pulse of each of the LO signals.

* * * * *